(12) United States Patent
Haberern et al.

(10) Patent No.: US 7,557,380 B2
(45) Date of Patent: Jul. 7, 2009

(54) LIGHT EMITTING DEVICES HAVING A REFLECTIVE BOND PAD AND METHODS OF FABRICATING LIGHT EMITTING DEVICES HAVING REFLECTIVE BOND PADS

(75) Inventors: Kevin Haberern, Cary, NC (US); Michael John Bergmann, Chapel Hill, NC (US); Van Mieczkowski, Apex, NC (US); David Todd Emerson, Durham, NC (US)

(73) Assignee: Cree, Inc., Durham, NC (US)

( * ) Notice: Subject to any disclaimer, the term of this patent is extended or adjusted under 35 U.S.C. 154(b) by 93 days.

(21) Appl. No.: 10/899,793

(22) Filed: Jul. 27, 2004

(65) Prior Publication Data

US 2006/0022209 A1    Feb. 2, 2006

(51) Int. Cl.
*H01L 33/00*    (2006.01)
(52) U.S. Cl. .............................. 257/81; 257/98; 257/99; 257/E33.028; 257/E33.068
(58) Field of Classification Search .................. 257/81, 257/98, 99; 438/27
See application file for complete search history.

(56) References Cited

U.S. PATENT DOCUMENTS

| | | | |
|---|---|---|---|
| 4,918,497 A | 4/1990 | Edmond | 257/77 |
| 4,966,862 A | 10/1990 | Edmond | 438/27 |
| 5,027,168 A | 6/1991 | Edmond | 257/103 |
| 5,210,051 A | 5/1993 | Carter, Jr. | 438/22 |
| 5,338,944 A | 8/1994 | Edmond et al. | 257/76 |
| 5,393,993 A | 2/1995 | Edmond et al. | 257/77 |
| 5,414,281 A | 5/1995 | Watabe et al. | |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 438/45 |
| 5,631,190 A | 5/1997 | Negley | 438/33 |

(Continued)

FOREIGN PATENT DOCUMENTS

EP    0 926 744 A2    6/1999

(Continued)

OTHER PUBLICATIONS

United States Patent Application entitled "Phosphor-Coated Light Emitting Diodes Including Tapered Sidewalls, and Fabrication Methods Therefor," U.S. Appl. No. 10/659,241, filed Sep. 9, 2003.

(Continued)

*Primary Examiner*—A. Sefer
(74) *Attorney, Agent, or Firm*—Myers Bigel Sibley & Sajovec, P.A.

(57) ABSTRACT

Light emitting devices include an active region of semiconductor material and a first contact on the active region. The first contact is configured such that photons emitted by the active region pass through the first contact. A photon absorbing wire bond pad is provided on the first contact. The wire bond pad has an area less than the area of the first contact. A reflective structure is disposed between the first contact and the wire bond pad such that the reflective structure has substantially the same area as the wire bond pad. A second contact is provided opposite the active region from the first contact. The reflective structure may be disposed only between the first contact and the wire bond pad. Methods of fabricating such devices are also provided.

11 Claims, 4 Drawing Sheets

U.S. PATENT DOCUMENTS

| | | | |
|---|---|---|---|
| 5,739,554 A | 4/1998 | Edmond et al. | 257/103 |
| 5,793,062 A | 8/1998 | Kish, Jr. et al. | 257/98 |
| 5,912,477 A | 6/1999 | Negley | 257/95 |
| 6,120,600 A | 9/2000 | Edmond et al. | 117/89 |
| 6,177,688 B1 | 1/2001 | Linthicum et al. | 257/77 |
| 6,187,606 B1 | 2/2001 | Edmond et al. | 438/46 |
| 6,201,262 B1 | 3/2001 | Edmond et al. | 257/77 |
| 6,258,618 B1 | 7/2001 | Lester | |
| 6,291,840 B1* | 9/2001 | Uemura et al. | 257/94 |
| 6,414,339 B1* | 7/2002 | Tsutsui | 257/99 |
| 6,441,403 B1 | 8/2002 | Chang et al. | |
| 6,495,862 B1 | 12/2002 | Okazaki et al. | |
| 6,534,797 B1* | 3/2003 | Edmond et al. | 257/97 |
| 6,919,585 B2* | 7/2005 | Liu | 257/97 |
| 6,946,372 B2* | 9/2005 | Kim | 438/487 |
| 7,101,780 B2* | 9/2006 | Uemura | 438/605 |
| 7,122,841 B2* | 10/2006 | Oh et al. | 257/81 |
| 7,141,828 B2* | 11/2006 | Venugopalan | 257/99 |
| 2002/0123164 A1 | 9/2002 | Slater et al. | 438/39 |
| 2003/0006418 A1 | 1/2003 | Emerson et al. | 257/77 |
| 2003/0146445 A1* | 8/2003 | Hen | 257/93 |
| 2003/0168663 A1 | 9/2003 | Slater et al. | 257/77 |
| 2003/0189212 A1* | 10/2003 | Yoo | 257/79 |
| 2003/0214807 A1 | 11/2003 | Liu | |
| 2005/0035355 A1* | 2/2005 | Konno et al. | 257/79 |

FOREIGN PATENT DOCUMENTS

| | | | |
|---|---|---|---|
| JP | 2000-294837 | * | 10/2000 |
| JP | 2004-349301 A | | 12/2004 |

OTHER PUBLICATIONS

United States Patent Application entitled "Group III Nitride Based Quantum Well Light Emitting Device Structures With an Indium Containing Capping Structure," U.S. Appl. No. 10/899,791, filed Jul. 27, 2004.

United States Patent Application entitled "Ultra-Thin Ohmic Contacts for P-Type Nitride Light Emitting Devices," U.S. Appl. No. 60/591,393, filed Jul 27, 2004.

Notification of Transmittal of the International Search Report and the Written Opinion of the International Searching Authority, or the Declaration, International Search Report, and Written Opinion of the International Searching Authority, PCT International Application No. PCT/US2005/010873, Apr. 26, 2006.

* cited by examiner

LIGHT EMITTING DEVICES HAVING A REFLECTIVE BOND PAD AND METHODS OF FABRICATING LIGHT EMITTING DEVICES HAVING REFLECTIVE BOND PADS

FIELD OF THE INVENTION

This invention relates to semiconductor light emitting devices and methods of fabricating light emitting devices.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. As is well known to those having skill in the art, a light emitting diode or laser diode, generally includes a diode region on a microelectronic substrate. The microelectronic substrate may be, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

Much development interest and commercial activity recently has focused on LEDs that are fabricated in or on silicon carbide, because these LEDs can emit radiation in the blue/green portions of the visible spectrum. See, for example, U.S. Pat. No. 5,416,342 to Edmond et al., entitled Blue Light-Emitting Diode With High External Quantum Efficiency, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency. See, for example, U.S. Pat. No. 6,177,688 to Linthicum et al., entitled Pendeoepitaxial Gallium Nitride Semiconductor Layers On Silicon Carbide Substrates, the disclosure of which is hereby incorporated herein by reference in its entirety as if set forth fully herein.

The efficiency of conventional LEDs may be limited by their inability to emit all of the light that is generated by their active region. When an LED is energized, light emitting from its active region (in all directions) may be prevented from exiting the LED by, for example, a light absorbing wire bond pad. Typically, in gallium nitride based LEDs, a current spreading contact layer is provided to improve the uniformity of carrier injection across the cross section of the light emitting device. Current is injected into the p-side of the LED through the bond pad and the p-type contact. The p-type contact layer provides for a substantially uniform injection of carriers into the active region. Thus, a substantially uniform photon emission across the active region may result from the use of a current spreading layer, such as a substantially transparent p-type contact layer. However, a wire bond pad is typically not a transparent structure and, therefore, photons emitted from the active region of the LED that are incident upon the wire bond pad may be absorbed by the wire bond pad. For example, in some instances approximately 70% of the light incident on the wire bond pad may be absorbed. Such photon absorption may reduce the amount of light that escapes from the LED and may decrease the efficiency of the LED.

SUMMARY OF THE INVENTION

Some embodiments of the present invention provide light emitting devices and/or methods of fabricating light emitting devices including an active region of semiconductor material and a first contact on the active region. The first contact is configured such that photons emitted by the active region pass through the first contact. A photon absorbing wire bond pad is provided on the first contact. The wire bond pad has an area less than the area of the first contact. A reflective structure is disposed between the first contact and the wire bond pad such that the reflective structure has less area than the first contact. A second contact is provided opposite the active region from the first contact.

In some embodiments, the reflective structure has substantially the same area as the wire bond pad. For example, the reflective structure may be congruent with the wire bond pad. In some embodiments, the reflective structure does not extend beyond the wire bond pad.

In some embodiments of the present invention, a p-type semiconductor material is disposed between the first contact and the active region. In other embodiments of the present invention, an n-type semiconductor material is disposed between the first contact and the active region. The active region may be a Group III-nitride based active region.

In particular embodiments of the present invention, the reflective structure includes a layer of reflective metal. The reflective structure may be self-aligned with the wire bond pad. In some embodiments of the present invention, the reflective structure includes a roughened area of the first contact and the wire bond pad is directly on the first contact. The roughened area may be self-aligned with the wire bond pad.

In still further embodiments of the present invention, the reflective structure includes a roughened area of the first contact and a reflective metal layer on the roughened area of the first contact.

DETAILED DESCRIPTION

Figure 1:
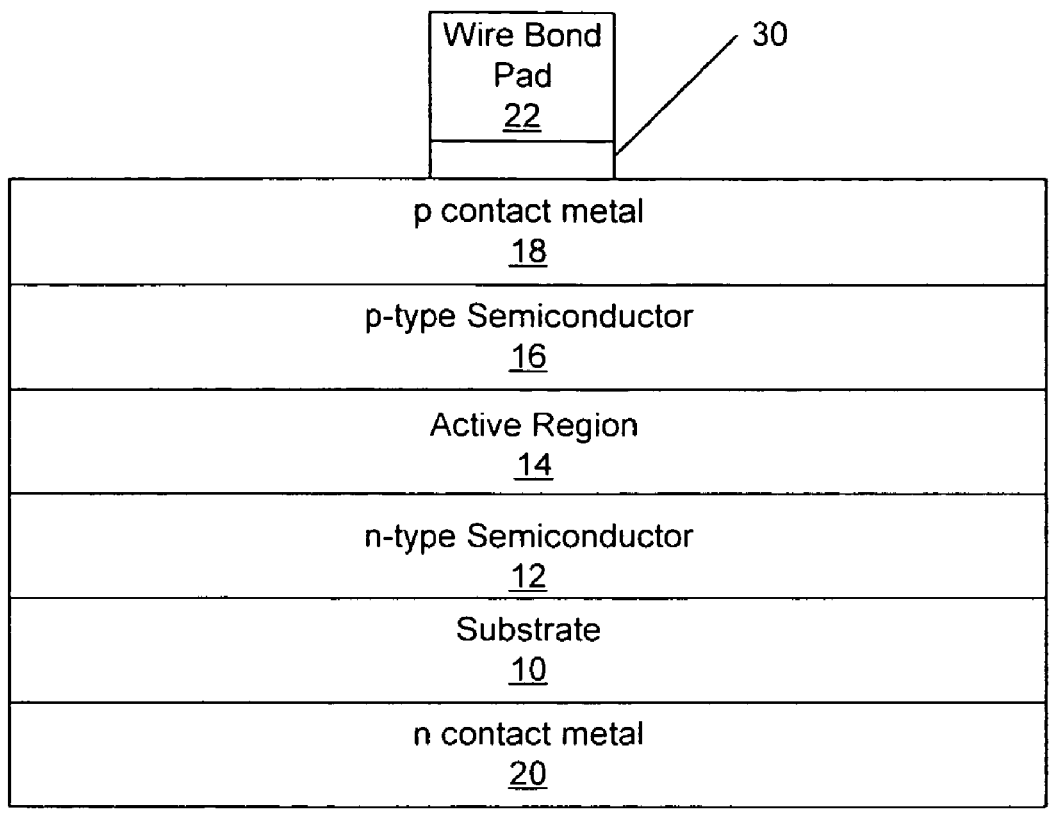
FIG. 1 is a cross-sectional view illustrating semiconductor light emitting devices having a reflective bond pad structure according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As Such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Although various embodiments of LEDs disclosed herein include a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Some embodiments of the present invention may provide for improved efficacy of a light emitting device by reducing and/or preventing photon absorption by a wire bond pad. Thus, some embodiments of the present invention may provide light emitting devices and methods of fabricating light emitting devices having a reflective structure between the wire bond pad and an ohmic contact of the light emitting device. By reflecting photons incident in the region of the wire bond pad, the amount of photons absorbed by the wire bond pad may be reduced. In some embodiments of the present invention, an increase in efficiency of the light emitting device may be proportional to the size of the wire bond pad.

Embodiments of the present invention may be particularly well suited for use in nitride-based light emitting devices such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leqq x \leqq 1$ are often used to describe them. However, while embodiments of the present invention are described herein with reference to Group III-nitride based light emitting devices, such as gallium nitride based light emitting devices, certain embodiments of the present invention may be suitable for use in other semiconductor light emitting devices, such as for example, GaAs and/or GaP based devices.

Light emitting devices according to some embodiments of the present invention may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green LEDs may be provided. The design and fabrication of semiconductor light emitting devices are well known to those having skill in the art and need not be described in detail herein.

For example, light emitting devices according to some embodiments of the present invention may include structures such as the gallium nitride-based LED and/or laser structures fabricated on a silicon carbide substrate such as those devices manufactured and sold by Cree, Inc. of Durham, N.C. The present invention may be suitable for use with LED and/or laser structures that provide active regions such as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LED and/or laser structures are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, U.S. patent application Ser. No. 10/899,791 entitled "GROUP III NITRIDE BASED QUANTUM WELL LIGHT EMITTING DEVICE STRUCTURES WITH AN INDIUM CONTAINING CAPPING STRUCTURE" filed concurrently herewith, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1. These structures may be modified as described herein to provide reflective structures according to some embodiments of the present invention.

Thus, for example, embodiments of the present invention may be utilized with light emitting devices having bond pads of differing shapes or sizes. The light emitting devices may be on differing substrates, such as silicon carbide, sapphire, gallium nitride, silicon or other substrate suitable substrate for providing Group III-nitride devices. The light emitting devices may be suitable for subsequent singulation and mounting on a suitable carrier. The light emitting devices may include, for example, single quantum well, multi-quantum well and/or bulk active region devices. Some embodiments of the present invention may be used with devices utilizing a tunneling contact on the p-side of the device.

FIG. 1 is a cross-sectional schematic illustration of a light emitting device according to some embodiments of the present invention. As seen in FIG. 1, a substrate 10, such as an n-type silicon carbide substrate, has an optional n-type semiconductor layer 12, such as a gallium nitride based layer, provided thereon. The n-type semiconductor layer 12 may include multiple layers, for example, buffer layers or the like. In some embodiments of the present invention, the n-type semiconductor layer 12 is provided as a silicon doped AlGaN layer, that may be of uniform or gradient composition, and a silicon doped GaN layer.

While described herein with reference to a silicon carbide substrate, in some embodiments of the present invention other substrate materials may be utilized. For example, a sapphire substrate, GaN or other substrate material may be utilized. In such a case, the contact 20 may be located, for example, in a recess that contacts the n-type semiconductor layer 12, so as to provide a second contact for the device. Other configurations may also be utilized.

An active region 14, such as a single or double heterostructure, quantum well, multi-quantum well or other such active region may be provided on the n-type semiconductor layer. As used herein, the term "active region" refers to a region of semiconductor material of a light emitting device, that may be one or more layers and/or portions thereof, where a substantial portion of the photons emitted by the device when in operation are generated by carrier recombination. In some embodiments of the present invention, the active region refers to a region where substantially all of the photons emitted by the device are generated by carrier recombination.

Also illustrated in FIG. 1 is an optional p-type semiconductor layer 16. The p-type semiconductor material layer 16 may, for example, be a gallium nitride based layer, such as a GaN layer. In particular embodiments of the present invention, the p-type semiconductor layer 16 includes magnesium doped GaN. The p-type semiconductor layer 16 may include one or multiple layers and may be of uniform or gradient composition. In some embodiments of the present invention, the p-type semiconductor layer 16 is part of the active region 14.

A first contact metal layer 18 of contact metal that provides an ohmic contact to the p-type semiconductor material layer 16 is also provided. In some embodiments, the first contact metal layer 18 may function as a current spreading layer. In particular embodiments of the present invention where the p-type semiconductor material layer 16 is GaN, the first contact metal layer 18 may be Pt. In certain embodiments of the present invention, the first contact metal layer 18 is light permeable and in some embodiments is substantially transparent such that photons emitted by the active region 14 may pass through the first contact metal layer 18. In some embodiments, the first contact metal layer 18 may be a relatively thin layer of Pt. For example, the first contact metal layer 18 may be a layer of Pt that is about 54 Å thick. A wire bond pad 22 or other light absorbing region is provided on the first contact metal layer 18. In some embodiments of the present invention, the first contact metal layer 18 is provided as a very thin layer having a thickness of less than about 10 Å as described in U.S. Provisional Patent Application Ser. No. 60/591,353 entitled "ULTRA-THIN OHMIC CONTACTS FOR P-TYPE NITRIDE LIGHT EMITTING DEVICES" and filed concurrently herewith, the disclosure of which is incorporated herein as if set forth in its entirety.

A second contact metal layer 20 of contact metal that provides an ohmic contact to the n-type semiconductor material is also provided. The second contact metal layer 20 may be provided on a side of the substrate 10 opposite the active region 14. The second contact metal layer 20 may also be provided on a same side of the substrate 10 as the active region 14. As discussed above, in some embodiments of the present invention the second contact metal layer 20 may be provided on a portion of the n-type semiconductor material layer 12, for example, in a recess or at a base of a mesa including the active region. Furthermore, in some embodiments of the present invention, an optional back-side implant or additional epitaxial layers may be provide between the substrate 10 and the second contact metal layer 20.

As is further illustrated in FIG. 1, a reflective structure is provided by a reflective metal layer 30 disposed between the wire bond pad 22 and the first metal contact layer 18. The reflective metal layer 30 has substantially the same shape and/or area as the area of the wire bond pad 22 on the first contact metal layer 18. In some embodiments of the present invention, the reflective metal layer 30 has a slightly larger area than the wire bond pad 22 while in other embodiments of the present invention, the reflective metal layer 30 has a slightly smaller area than the wire bond pad 22. Such variations may, for example, be the result of manufacturing tolerances or variations resulting from the fabrication sequence, alignment tolerances or the like. In certain embodiments, the reflective metal layer 30 may also have exactly the same area as the wire bond pad 22. The reflective metal layer 30 may be a layer of silver (Ag), aluminum (Al) or other reflective conducting metal.

By providing a reflective structure between the photon absorbing wire bond pad and the active region the amount of photons absorbed by the wire bond pad may be reduced. Furthermore, by the reflective structure being substantially the same area as the wire bond pad, photon emission through the p-contact metal layer may still be provided. Accordingly, the overall light extraction from the device may be increased.

Figure 2A:
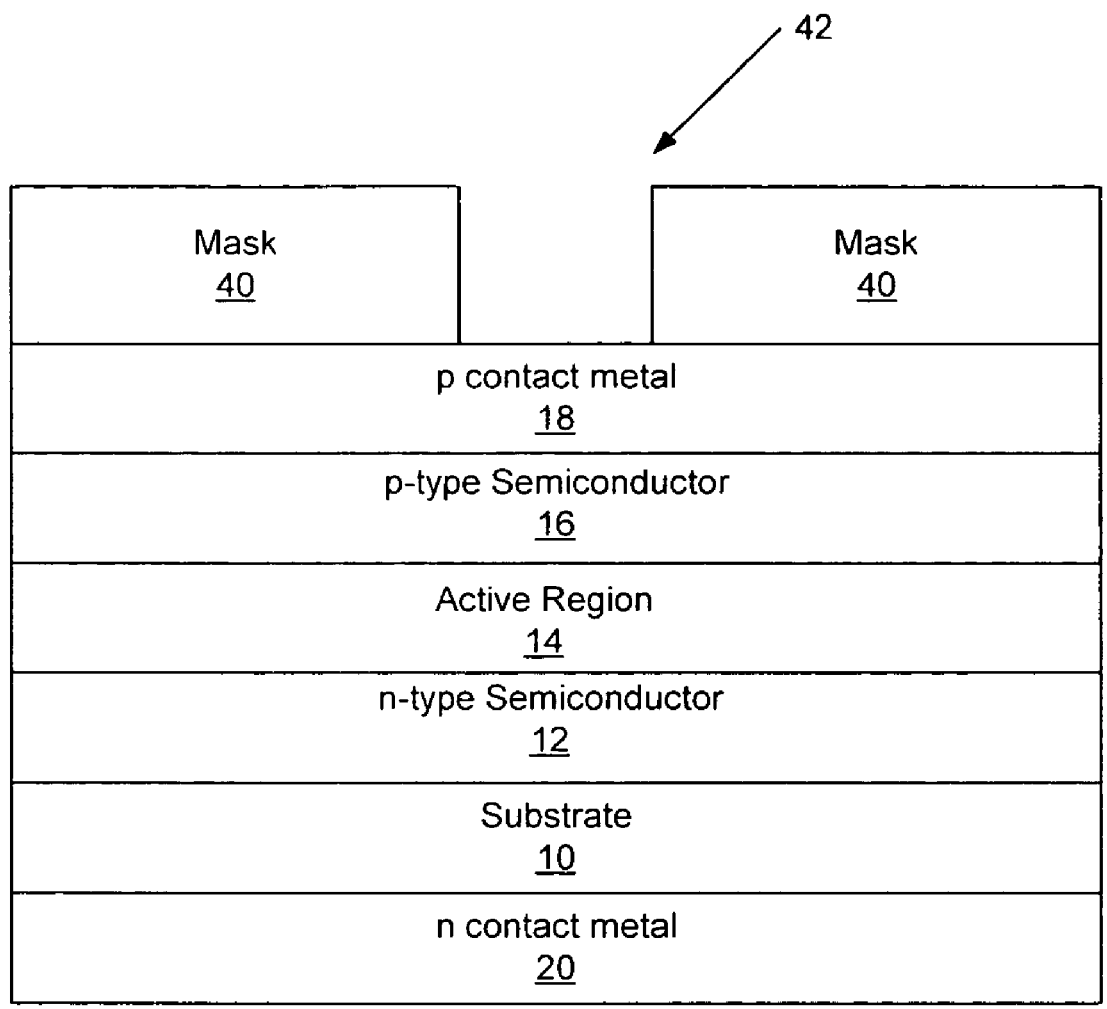
FIGS. 2A and 2B are cross-sectional views illustrating fabrication of semiconductor devices according to some embodiments of the present invention.
Figure 2B:
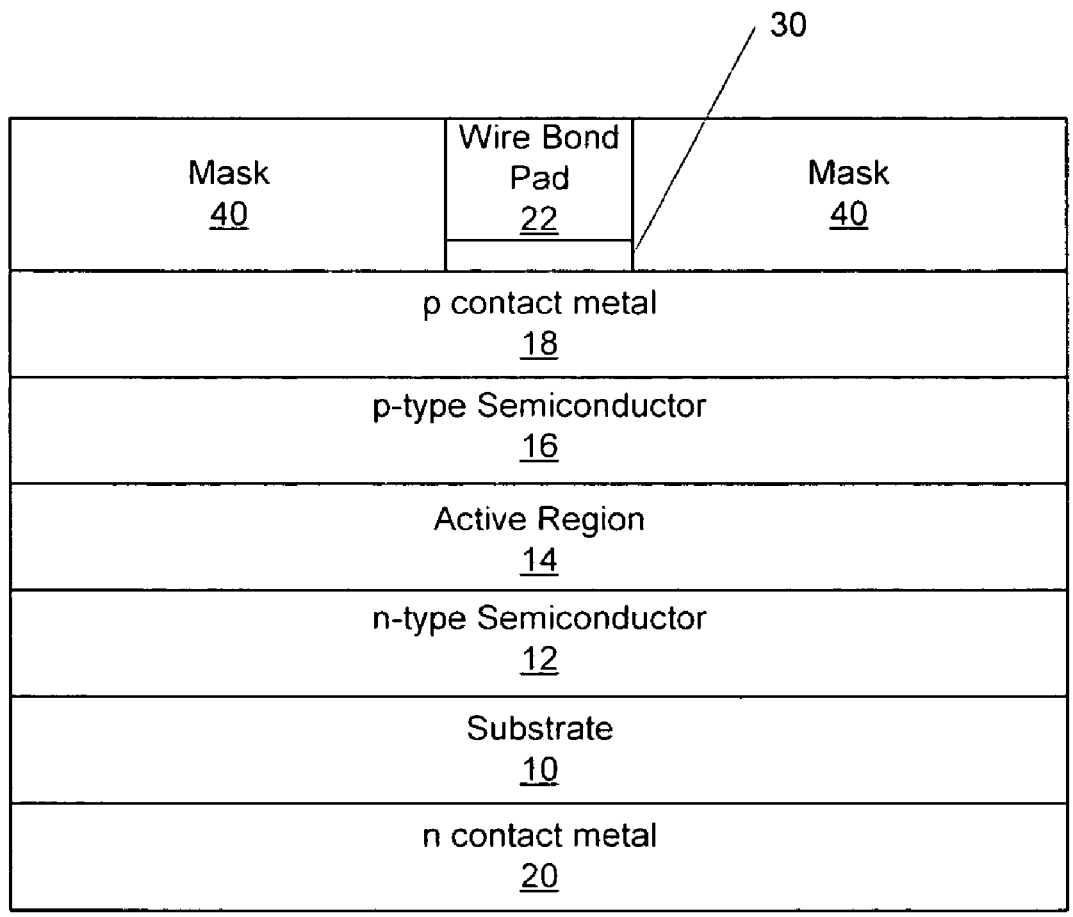

FIGS. 2A and 2B illustrate operations according to some embodiments of the present invention for forming light emitting devices having a reflective structure as illustrated in FIG. 1. As seen in FIG. 2A, the various layers/regions of the light emitting device are fabricated. The particular operations in the fabrication of the light emitting device will depend on the structure to be fabricated and are described in the United States Patents and/or Applications incorporated by reference herein and/or are well known to those of skill in the art and, therefore, need not be repeated herein. FIG. 2A also illustrates formation of a mask 40 having a window 42 that exposes a portion of the first contact layer 18 corresponding to the region where the wire bond pad 22 is to be formed.

A reflective layer 30 is deposited using the mask 40 so as to be substantially aligned with the region of the wire bond pad 22 as seen in FIG. 2B. Techniques for the deposition of reflective conductive metals are known to those of skill in the art and need not be described further herein. After formation of the reflective layer 30, the wire bond pad 22 may be formed in the window 42. Thus, in some embodiments of the present invention, the wire bond pad 22 and the reflective layer 30 may be self-aligned. The wire bond pad 22 may be formed, for example, by forming a layer or layers of the metal from which the wire bond pad 22 is formed and then planarizing the layers to provide the wire bond pad 22. The mask 40 may subsequently be removed. Optionally, the mask 40 may be made of an insulating material, such as SiO$_2$ and/or AlN, and may remain on the device as, for example, a passivation layer, or be removed. Alternatively, layers of reflective metal and/or bond pad metal could be blanket deposited and then etched to provide the reflective layer 30 and the wire bond pad 22.

Figure 3:
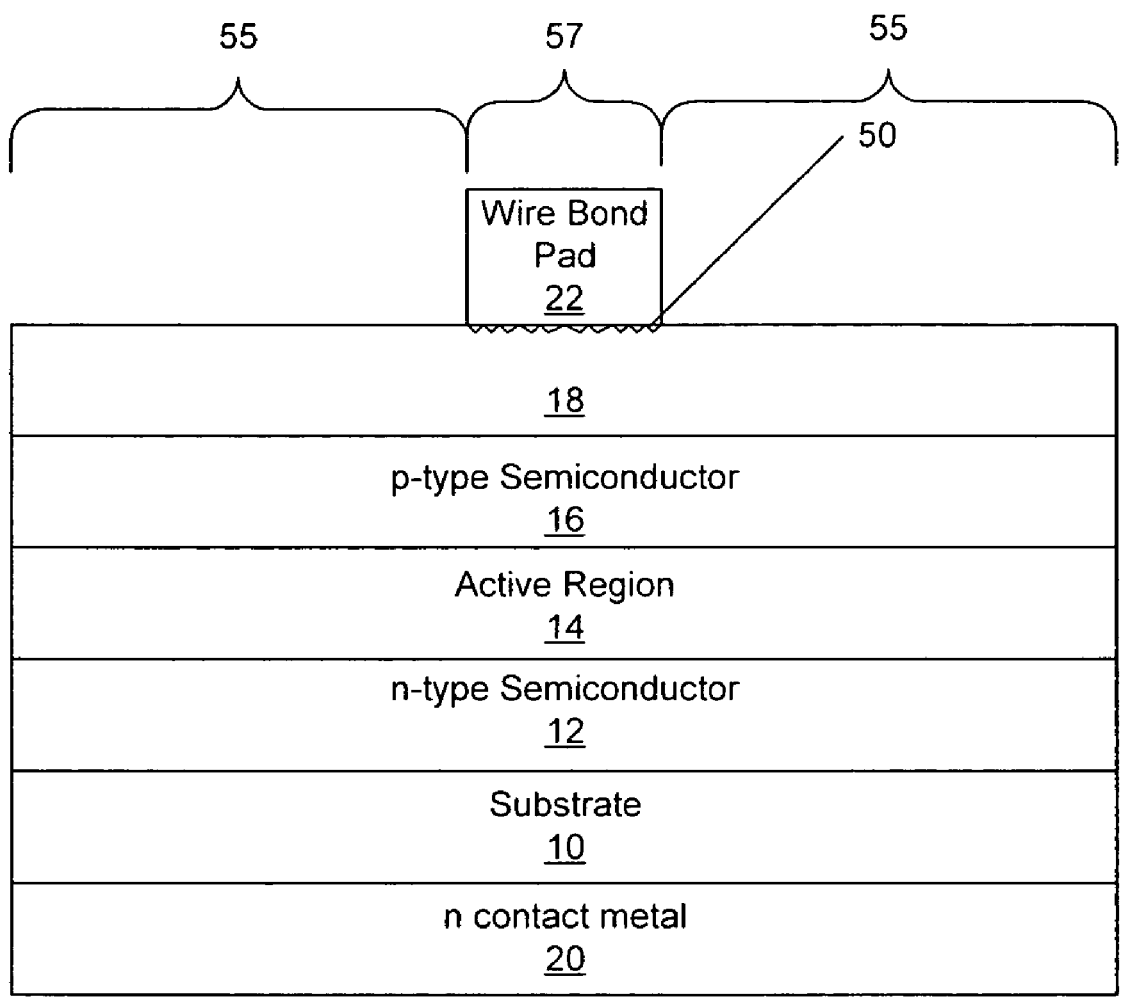
FIG. 3 is a cross-sectional view of light emitting devices according to further embodiments of the present invention.

FIG. 3 illustrates light emitting devices according to further embodiments of the present invention. In FIG. 3, the first contact metal layer 18 includes a first portion 55 outside the area of the wire bond pad 22 and a second portion 57 in the area of the wire bond pad 22. The second portion 57 includes a roughened area 50 where the surface of the first contact metal layer 18 provides greater internal reflection of photons incident upon the surface than is provided by the surface of the first portion 55 of the first contact metal layer 18. For example, the roughened area 50 may include angled surfaces from which the photons are reflected rather than pass through. The roughened area 50 may have the same shape and/or area as the area of the wire bond pad 22 on the first contact metal layer 18. In some embodiments of the present invention, the roughened area 50 has a slightly larger area than the wire bond pad 22 while in other embodiments of the present invention, the roughened area 50 has a slightly smaller area than the wire bond pad 22. In particular embodiments of the present invention, the roughened area has exactly the same shape and area as the wire bond pad 22.

The roughened area 50 may be provided by, for example, etching the area where the wire bond pad 22 is formed. Such an etch may utilize the mask 40 illustrated in FIG. 2A which may be provided prior to formation of the wire bond pad 22. Other techniques for roughening the interface may also be utilized.

By providing a roughened area beneath the wire bond pad, angled surfaces may be provided as a reflective structure that increases the internal reflection of light back into the contact layer. Thus, the amount of light absorbed by the wire bond pad may be reduced.

While embodiments of the present invention are illustrated in FIGS. 1 through 3 with reference to particular light emitting device structures, other structures may be provided according to some embodiments of the present invention. Thus, embodiments of the present invention may be provided by any light emitting structure that includes one or more of the various reflective structures as described above. For example, wire bond pad reflective structures according to some embodiments of the present invention may be provided in conjunction with the exemplary light emitting device structures discussed in the United States Patents and/or Applications incorporated by reference herein.

Embodiments of the present invention have been described with reference to a wire bond pad 22. As used herein, the term bond pad refers to a light absorbing contact structure to which a wire is subsequently bonded. A bond pad may be a single or multiple layers, may be a metal and/or metal alloy and/or may be of uniform of non-uniform composition.

Embodiments of the present invention have been described with reference to the wire bond pad being provided on the contact to the p-type semiconductor material, however, the wire bond pad could, alternatively, be provided to the n-type semiconductor material, such as the substrate 10. In such a case, the reflective structures described above could be disposed between the second contact metal layer 20 and a wire bond pad on that layer. Furthermore, any suitable contact metal and/or reflective metal may be utilized for the first and second contact metal layers 18 and 20 and the reflective layer 30. For example, metal and reflective layers as well as stacks of layers may be provided as described in United States Patent Publication No. US 2002/0123164 A1, published Sep. 5, 2002 and entitled "Light Emitting Diodes Including Modifications For Light Extraction and Manufacturing Methods Therefore" and/or United States Patent Publication No. US 2003/0168663 A1, published Sep. 11, 2003 and entitled "Reflective Ohmic Contacts For Silicon Carbide Including a Layer Consisting Essentially of Nickel, Methods of Fabricating Same, and Light Emitting Devices Including the Same," the disclosures of which are incorporated herein as if set forth fully herein.

Furthermore, while embodiments of the present invention have been described with reference to a particular sequence of operations, variations from the described sequence may be provided while still benefiting from the teachings of the present invention. Thus, two or more steps may be combined into a single step or steps performed out of the sequence described herein. Thus, embodiments of the present invention should not be construed as limited to the particular sequence of operations described herein unless stated otherwise herein.

It will be understood by those having skill in the art that various embodiments of the invention have been described individually in connection with FIGS. 1-3. However, combinations and subcombinations of the embodiments of FIGS. 1-3 may be provided according to various embodiments of the present invention. For example, the structures of FIGS. 1 and 3 may be combined by providing the reflective layer 30 on the roughened area 50.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
   an active region comprising semiconductor material;
   a first contact metal on the active region, the first contact metal having a first face adjacent the active region and a second face remote from the active region, and being sufficiently thin such that photons emitted by the active region pass through the first contact metal from the first face to the second face;
   a photon absorbing wire bond pad on the second face of the first contact metal, the wire bond pad having an area less than the area of the first contact metal;
   a reflective structure disposed entirely between the second face of the first contact metal and the wire bond pad and extending on the second face of the first contact metal to be substantially congruent with the wire bond pad; and
   a second contact metal opposite the active region from the first contact metal,
   wherein the reflective structure comprises a layer of silver or aluminum directly on the second face of the first contact metal.

2. The light emitting device of claim 1, further comprising a p-type semiconductor material disposed between the first contact metal and the active region.

3. The light emitting device of claim 1, further comprising an n-type semiconductor material between the first contact and the active region.

4. The light emitting device of claim 1, wherein the active region comprises a Group III-nitride based active region.

5. The light emitting device of claim 1, wherein the layer of reflective metal is self-aligned with the wire bond pad.

6. A method of fabricating a light emitting device, comprising:
   forming an active region of semiconductor material;
   forming a first contact metal on the active region, the first contact metal having a first face adjacent the active region and a second face remote from the active region, and being sufficiently thin such that photons emitted by the active region pass through the first contact metal from the first face to the second face;
   forming a reflective structure entirely on the second face of the first contact metal and having an area less than an area of the first contact metal;
   forming a photon absorbing wire bond pad on reflective structure, the wire bond pad being substantially congruent to the reflective structure; and
   forming a second contact metal opposite the active region from the first contact metal,
   wherein forming a reflective structure comprises forming a reflective structure that comprises a layer of silver or aluminum directly on the second face of the first contact metal.

7. The method of claim 6, further comprising forming a p-type semiconductor material disposed between the first contact metal and the active region.

8. The method of claim 6, further comprising forming an n-type semiconductor material between the first contact and the active region.

9. The method of claim 6, wherein forming an active region comprises forming a Group III-nitride based active region.

10. The method of claim 6, wherein forming a reflective structure comprises forming a layer of reflective metal entirely on the second face of the first contact metal.

11. The method of claim 6, wherein forming a reflective structure and forming a wire bond pad comprises:
    forming a mask layer on the first contact, the mask layer having an opening that exposes a portion of the first contact corresponding to the location of the wire bond pad on the first contact;
    depositing a reflective metal layer in the opening of the mask layer; and
    forming the wire bond pad on the reflective metal layer in the opening of the mask layer.

* * * * *